(12) United States Patent
Novack et al.

(10) Patent No.: US 10,411,149 B2
(45) Date of Patent: Sep. 10, 2019

(54) LATERAL AVALANCHE PHOTODETECTOR

(71) Applicant: Elenion Technologies, LLC, New York, NY (US)

(72) Inventors: Ari Novack, New York, NY (US); Yang Liu, Elmhurst, NY (US); Yi Zhang, Jersey City, NJ (US)

(73) Assignee: Elenion Technologies, LLC, New York, NY (US)

( * ) Notice: Subject to any disclaimer, the term of this patent is extended or adjusted under 35 U.S.C. 154(b) by 0 days.

(21) Appl. No.: 16/168,249

(22) Filed: Oct. 23, 2018

(65) Prior Publication Data

US 2019/0051784 A1 Feb. 14, 2019

Related U.S. Application Data

(63) Continuation of application No. 15/664,856, filed on Jul. 31, 2017, now Pat. No. 10,134,938, which is a continuation of application No. 14/818,060, filed on Aug. 4, 2015, now Pat. No. 9,755,096, which is a continuation-in-part of application No. 14/644,122, filed on Mar. 10, 2015, now Pat. No. 9,437,759.

(60) Provisional application No. 61/950,816, filed on Mar. 10, 2014.

(51) Int. Cl.
*H01L 31/107* (2006.01)
*H01L 31/028* (2006.01)
*H01L 31/0352* (2006.01)
*H01L 31/0232* (2014.01)
*H01L 31/18* (2006.01)

(52) U.S. Cl.
CPC ........ *H01L 31/1075* (2013.01); *H01L 31/028* (2013.01); *H01L 31/02327* (2013.01); *H01L 31/035281* (2013.01); *H01L 31/107* (2013.01); *H01L 31/1804* (2013.01); *Y02E 10/50* (2013.01)

(58) Field of Classification Search
CPC .............. H01L 31/0237; H01L 31/028; H01L 31/0352; H01L 31/035272; H01L 31/035281; H01L 31/107; H01L 31/1075; H01L 31/18; H01L 31/1804; H01L 31/02327
See application file for complete search history.

(56) References Cited

U.S. PATENT DOCUMENTS

| 7,397,101 | B1 * | 7/2008 | Masini ................. H01L 31/028 257/184 |
| 9,437,759 | B2 * | 9/2016 | Baehr-Jones ....... H01L 31/1808 |
| 9,553,222 | B2 * | 1/2017 | Baehr-Jones ....... H01L 31/1808 |
| 2007/0096240 | A1 * | 5/2007 | Yao .................. H01L 31/03046 257/458 |
| 2010/0012974 | A1 * | 1/2010 | Shih ...................... H01L 31/028 257/185 |
| 2014/0291682 | A1 * | 10/2014 | Huang ................ H01L 31/1075 257/55 |

(Continued)

*Primary Examiner* — Stephen W Smoot
(74) *Attorney, Agent, or Firm* — Stratford Managers Corporation

(57) ABSTRACT

A lateral Ge/Si APD constructed on a silicon-on-insulator wafer includes a silicon device layer having regions that are doped to provide a lateral electric field and an avalanche region. A region having a modest doping level is in contact with a germanium body. There are no metal contacts made to the germanium body. The electrical contacts to the germanium body are made by way of the doped regions in the silicon device layer.

19 Claims, 6 Drawing Sheets

(56) References Cited

U.S. PATENT DOCUMENTS

| | | | |
|---|---|---|---|
| 2015/0243800 A1* | 8/2015 | Shi | H01L 31/024 257/186 |
| 2016/0155884 A1* | 6/2016 | Hon | H01L 31/022408 250/200 |
| 2016/0211402 A1* | 7/2016 | Joo | H01L 31/022416 |

* cited by examiner

LATERAL AVALANCHE PHOTODETECTOR

CROSS-REFERENCE TO RELATED APPLICATIONS

This application is a continuation of U.S. patent application Ser. No. 15/664,856, filed Jul. 31, 2017, now U.S. Pat. No. 10,134,938 B2, which is a continuation of U.S. patent application Ser. No. 14/818,060, filed Aug. 4, 2015, now U.S. Pat. No. 9,755,096, which is a continuation-in-part of U.S. patent application Ser. No. 14/644,122, filed Mar. 10, 2015, now issued U.S. Pat. No. 9,437,759, which application claims priority to and the benefit of U.S. provisional patent application Ser. No. 61/950,816, filed Mar. 10, 2014, each of which applications is incorporated herein by reference in its entirety.

FIELD OF THE INVENTION

The invention relates to photodetectors in general and particularly to an avalanche photodetector.

BACKGROUND OF THE INVENTION

Avalanche photodetectors (APD) provide higher sensitivity than p-i-n photodetectors because of the internal gain from avalanche multiplication. APDs are useful in optical receivers for a number of applications. Due to the uncertainties of the total number of impact ionizations, there is amplitude noise on the avalanche gain. The noise is determined by avalanche multiplication material, characterized by the ionization rate ratio between electrons and holes, k. Similar ionization rate between electrons and holes, i.e., k≈1, corresponds to high noise, while low ionization rate between electrons and holes, i.e., k≈0 corresponds to low noise.

Silicon is transparent to the a set wavelengths used in optical fiber communication systems, 1.3 μm-1.6 μm, so epitaxial germanium is typically used for light absorbing material in photodetectors in silicon photonics. However, germanium has a k close to 1, making it a noisy avalanche material. On the other hand, silicon has a very small k<0.1, which is preferable for avalanche. Thus, prior art APDs usually have separate absorption and multiplication regions, as shown in FIG. 1.

The electric field in different layers is illustrated in FIG. 2. In the absorption region, the electric field needs to be high enough to drive the photo-generated carriers at their drift saturation velocity, while low enough to avoid avalanche multiplication, which sets it in the 10 to 100 kV/cm range. In the avalanche region, the field needs to be high enough, greater than 300 kV/cm, for efficient multiplication.

The conventional prior art APD has a complicated layer structure, which requires multiple epitaxy and doping steps. Typically this type of geometry would be used for vertical incidence detection where light is traveling perpendicular to the plane of the chip. However, integrated optics require waveguide-coupled detectors in which the light is travelling in the plane of the chip. It is difficult to convert the conventional APD structure to work as a waveguide coupled device due to its numerous epitaxial steps.

There is a need for improved avalanche photodiode device structures that allow simpler and less costly fabrication.

SUMMARY OF THE INVENTION

According to one aspect an avalanche photodetector, comprising:

a substrate;
a device layer including a plurality of regions on the substrate, comprising:
a first contact region including a first level of p or n doping,
a modest doping region,
a charge region including a same kind of doping as the first contact region, but at a second level of doping, less than said first level of doping,
an avalanche region, and
a second contact region including a third level of doping, opposite in kind to the first and third regions;
a light-absorbing body adjacent to the device layer;
a first electrical terminal in electrical communication with the first contact region; and
a second electrical terminal in electrical communication the second contact region.

The modest doping region may include a doping level that is lower than either the first contact region or the charge region.

The modest doping region may include a doping level that is lower than either the first contact region or the charge region by approximately an order of magnitude.

The avalanche region may include a doping level that is lower than either the first contact region or the charge region.

The avalanche region may include a doping level that is lower than either the first contact region or the charge region by approximately an order of magnitude.

The light-absorbing body may be in electrical contact with at least one of the charge region, the modest doping region, and the first contact region, wherein there are no metal contacts with the light-absorbing body.

The avalanche photodetector may further comprise an oxide layer covering the light-absorbing body preventing metal contact with the light-absorbing body.

The light-absorbing body may be in electrical contact with the charge region.

The light-absorbing body may be in electrical contact with the modest doping region, and not in mechanical contact with the first contact region or the charge region.

The light-absorbing body may comprise a material with a ionization rate of approximately 1.

The light-absorbing body may comprise germanium.

The light-absorbing body may include doping.

The light-absorbing body may consist of an intrinsic germanium body.

The device layer may comprise a material with an ionization rate of less than 0.1.

The device layer may comprise silicon.

The substrate may comprise a semiconductor wafer.

The semiconductor wafer may comprise a silicon-on-insulator wafer including the silicon device layer.

The light-absorbing body may comprise a triangular shape.

The avalanche photodetector may further comprise a buffer layer between the light-absorbing body and the device layer comprising at least one of SiGe, amorphous Ge, and SiN.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION

Acronyms

A list of acronyms and their usual meanings in the present document (unless otherwise explicitly stated to denote a different thing) are presented below.

AMR Adabatic Micro-Ring
APD Avalanche Photodetector
ARM Anti-Reflection Microstructure
ASE Amplified Spontaneous Emission
BER Bit Error Rate
BOX Buried Oxide
CMOS Complementary Metal-Oxide-Semiconductor
CMP Chemical-Mechanical Planarization
DBR Distributed Bragg Reflector
DC (optics) Directional Coupler
DC (electronics) Direct Current
DCA Digital Communication Analyzer
DRC Design Rule Checking
DUT Device Under Test
ECL External Cavity Laser
FDTD Finite Difference Time Domain
FOM Figure of Merit
FSR Free Spectral Range
FWHM Full Width at Half Maximum
GaAs Gallium Arsenide
InP Indium Phosphide
$LiNO_3$ Lithium Niobate
LIV Light intensity (L)-Current (I)-Voltage (V)
MFD Mode Field Diameter
MPW Multi Project Wafer
NRZ Non-Return to Zero
PIC Photonic Integrated Circuits
PRBS Pseudo Random Bit Sequence
PDFA Praseodymium-Doped-Fiber-Amplifier
PSO Particle Swarm Optimization
Q Quality factor $$Q = 2\pi \times \frac{\text{Energy Stored}}{\text{Energy dissipated per cycle}} = 2\pi f_r \times \frac{\text{Energy Stored}}{\text{Power Loss}}.$$

QD Quantum Dot
RSOA Reflective Semiconductor Optical Amplifier
SOI Silicon on Insulator SEM Scanning Electron Microscope
SMF Single Mode Fiber
SMSR Single-Mode Suppression Ratio
TEC Thermal Electric Cooler
WDM Wavelength Division Multiplexing We device structure that achieves the same avalanche photodetector function that is found in prior art APDs, but can be easily integrated with waveguides attached to photonic integrated circuits. The electric field in the device is in the plane of the wafer, rather than orthogonal to the wafer. The device structure is compatible with typical silicon photonics process flows. No Ge doping or Metal-Ge direct contact is required. Since the doped regions are fabricated in silicon, in common with those used for fabricating silicon optical modulators, compared to a pure modulator flow, the only significant extra step that is required is germanium epitaxy.

Figure 1:
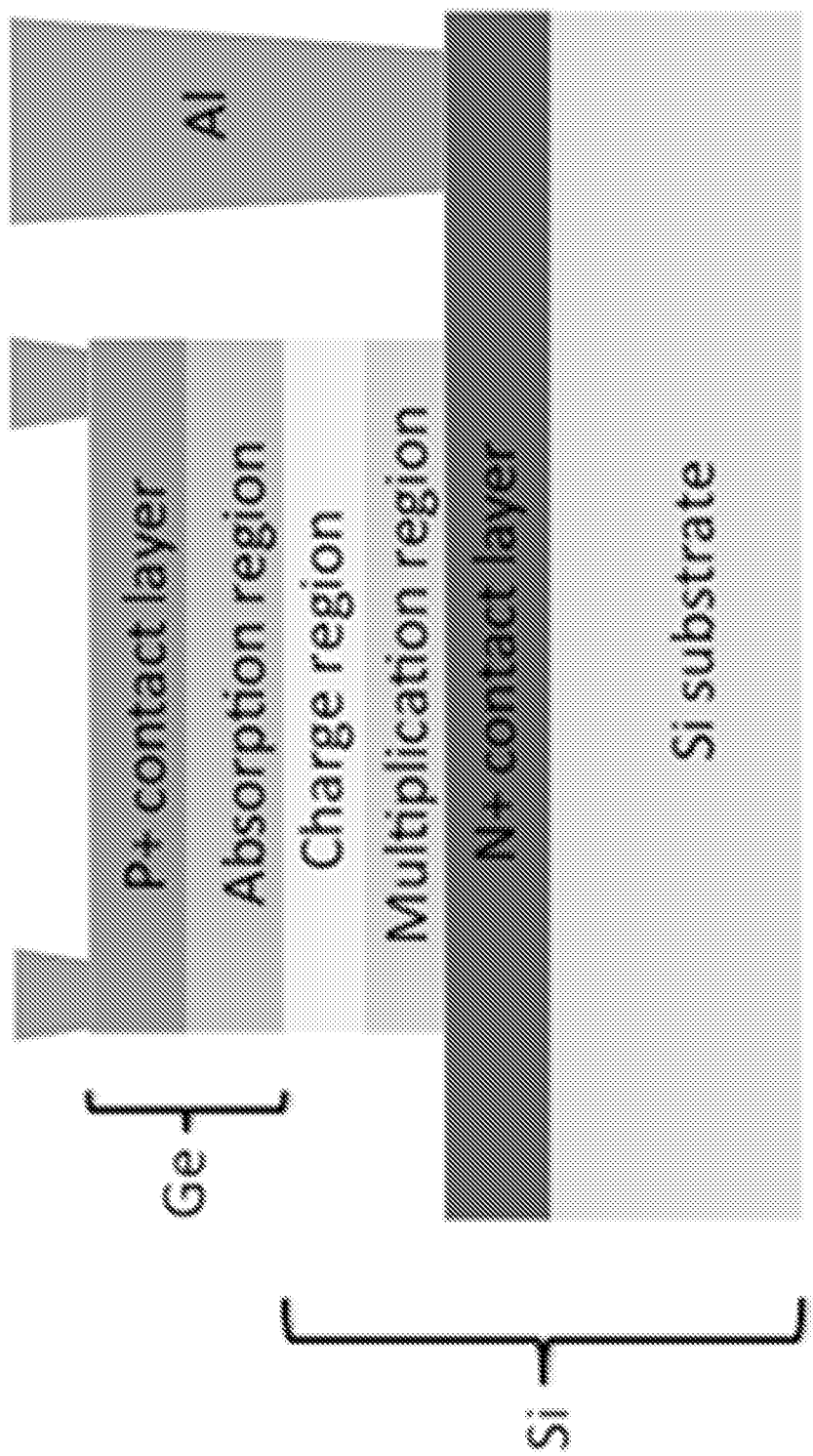
FIG. 1 is a schematic diagram of a conventional prior art vertical Ge/Si APD.
Figure 2:
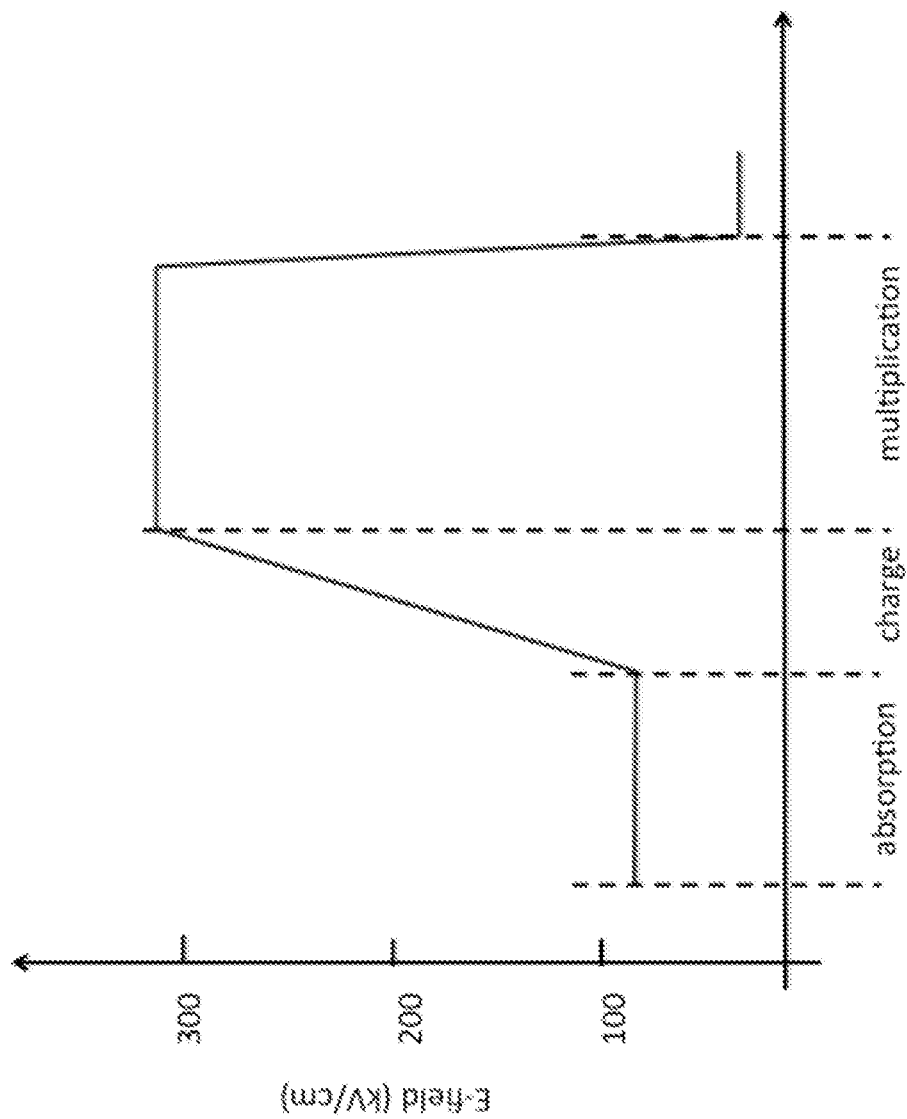
FIG. 2 is a graph showing the electrical field strength in different layers of an APD.
Figure 3:
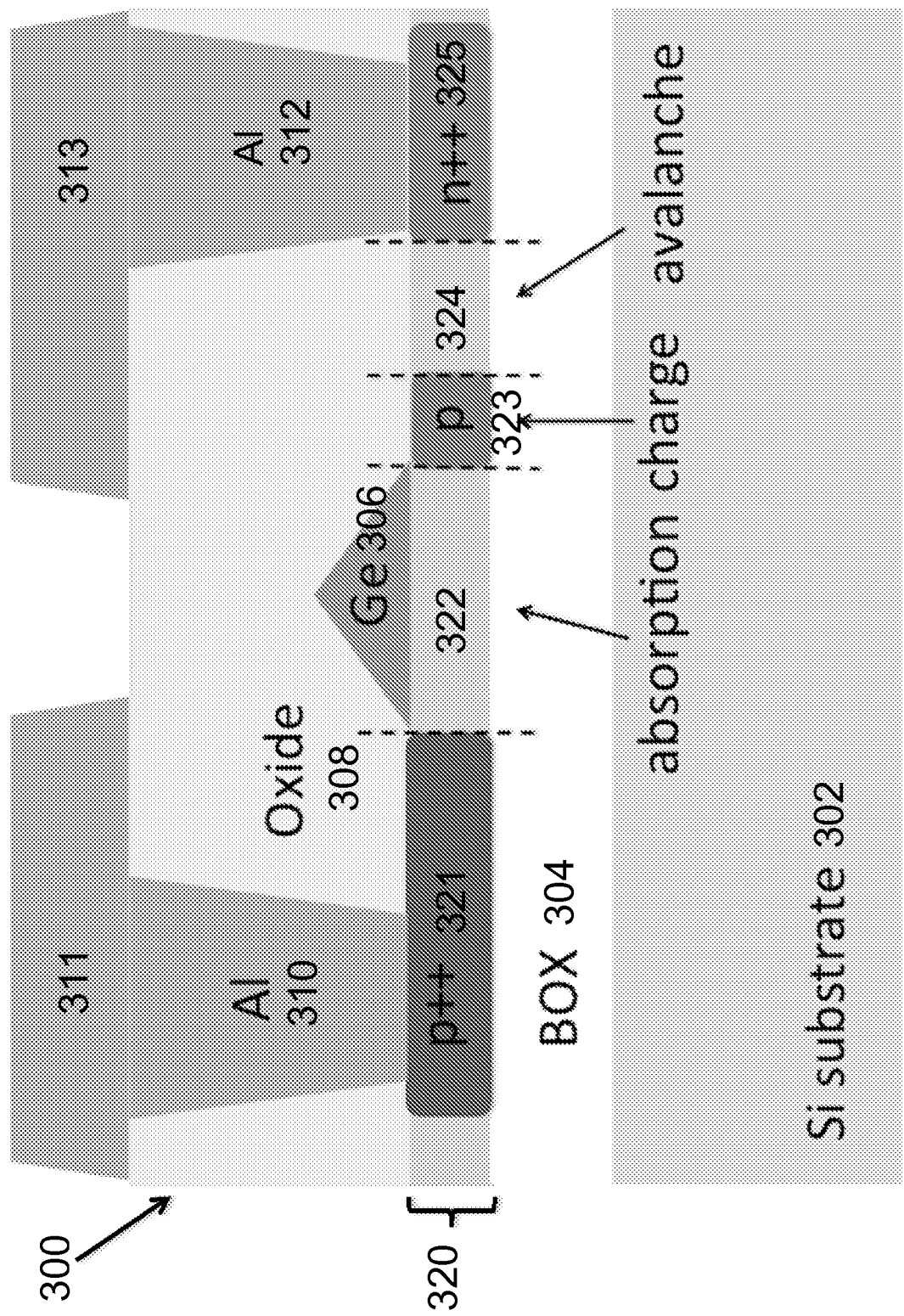
FIG. 3 is a cross sectional diagram of a lateral Ge/Si APD according to principles of the invention.

FIG. 3 is a cross sectional diagram of a lateral Ge/Si APD according to principles of the invention. As shown in the embodiment of FIG. 3 a silicon-on-insulator wafer is used to provide a silicon substrate 302. A buried oxide (BOX) layer 304 is present in contact with the silicon substrate. A silicon device layer 320 is present in contact with the BOX 304 layer. In the silicon device layer 320, there are regions that are doped. A $p^{++}$ doped region 321 is provided, as illustrated in FIG. 3. Adjacent the $p^{++}$ doped region 321 is a region 322 having a modest doping level. In the silicon device layer 320 adjacent the region 322 is a p+ doped region 323. In the silicon device layer 320 adjacent the p+ doped region 323 is a region 324 having a modest doping level. In the silicon device layer 320 adjacent the region 324 is an $n^{++}$ doped region 325. In some embodiments, the p+ doping is of the order of 1E15 to 1E17 per cubic centimeter. In some embodiments, both p++ and n++ doping are greater 1E18 per cubic centimeter. In other embodiments, the device of the invention can be fabricated on a substrate, such as a semiconductor wafer, or a substrate made from other materials that are not semiconductors, such as quartz, aluminum oxide, sapphire, and the like.

The germanium body 306 is deposited adjacent the silicon device layer 320, for example by epitaxy after all of the doped regions in the silicon device layer 320 are completed. In some embodiments, the region 321 is in electrical contact with the germanium body 306. In some embodiments, the region 322 is in contact electrical with the germanium body 306. In some embodiments, the region 323 is in electrical contact with the germanium body 306. In other embodiments, the germanium body 306 is not in mechanical contact with either or both of regions 321 and 323. The discussion of how the germanium body 306 may be fabricated is described in further detail in co-pending U.S. patent application Ser. No. 14/644,122.

In some embodiments, the regions having a modest doping level may have additional doping added simply as an artifact of the doping of nearby, or adjacent, regions. This additional doping may come about by inaccuracies in locating a dopant deposition or implantation or by diffusion of dopant during an annealing, activation or heat treatment step in the course of ordinary semiconductor processing. In some embodiments, a region having a modest doping level can have an effective doping that is lower than either the $p^{++}$ doped region 321 or the $p^+$ doped region 323. In some embodiments, a region having a modest doping level can have an effective doping that is lower by approximately one order of magnitude than either the $p^{++}$ doped region 321 or the $p^+$ doped region 323. In some embodiments, the p-type dopant is boron (B). In some embodiments, the n-type dopants are one or more of phosphorus (P), arsenic (As) and antimony (Sb).

An oxide layer 308 is provided that covers the silicon device layer 320 and the germanium body 306. There are no metal contacts made to the germanium body 306. The electrical contacts to the germanium body 306 are made by way of the $p^{++}$ doped region 321 on one side and by way of the $p^+$ doped region 323, the region 324 and the $n^{++}$ doped region 325 on the other side. A voltage is applied to the device such that the electrons that are generated in the Ge body are allowed to move into the region 322, and then to the avalanche region 324, while the holes that are generated in the Ge body are allowed to move to the p++ region 321. Aluminum conductors 310 and 312 are provided to connect the $p^{++}$ doped region 321 with a p terminal 311 and the $n^{++}$ doped region 325 with an n terminal 313, respectively, so that the electrical signal generated in the APD can be observed or used. In some embodiments, the conductors 310 and 312 can be fabricated using metals other than aluminum, for example, Cu, W or other common conductor metals.

The device shown in FIG. 3 keeps separate the absorption region (in the germanium) and the multiplication region (in the silicon device layer) for low noise APD behavior. Moreover, the germanium crystal quality is preserved as produced by epitaxy, free from degradation which would be caused by ion implantation or metal contacting.

During germanium epitaxy, the growth rate is different at different crystal orientations. Growth in the <311> crystallographic direction may be slower than growth in the <100> crystallographic direction, thus a triangular (or non-planar) shape may be formed. As used herein, the < > notation is used to identify a family of equivalent directions (i.e., <100> includes the [100] direction, the [010] direction, the [001] direction and their opposite directions, such as [−100]).

The steps used to fabricate the device are to first produce all of the regions 321, 322, 323, 324 and 325 in the silicon device layer, and then provide the oxide layer 308. The Ge body 306 can be deposited in an aperture produced in the oxide layer 308. One or more layers can be deposited over the Ge body to provide mechanical protection and/or optical coatings, such as anti-reflection coatings. The metallization can then be applied.

Alternative Embodiments

Figure 6:
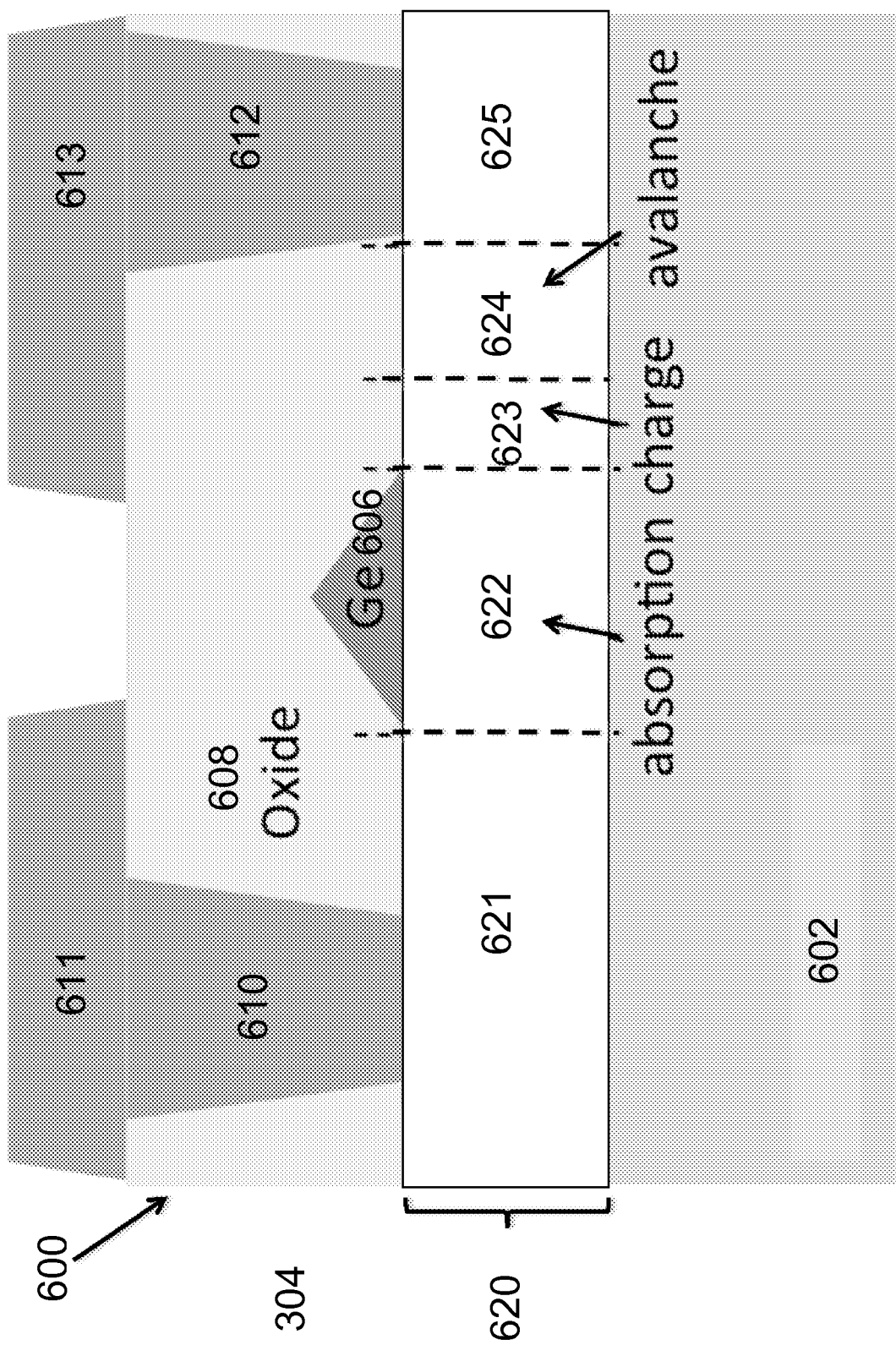
FIG. 6 is a cross sectional diagram of an alternative embodiment of a lateral Ge APD according to principles of the invention.

FIG. 6 is a cross sectional diagram of an alternative embodiment of a lateral Ge APD according to principles of the invention.

As shown in the embodiment of FIG. 6 a substrate 602 is provided. A silicon device layer 620 is present in contact with the substrate 602. In the silicon device layer 620, there are regions that are doped. A $p^{++}$ doped region 621 is provided, as illustrated in FIG. 6. Adjacent the $p^{++}$ doped region 621 is a region 622 in which a modest doping level is introduced into the silicon device layer. In the silicon device layer 620 adjacent the region 622 is a p+ doped region 623. In the silicon device layer 620 adjacent the p+ doped region 623 is a region 624 in which a modest doping level is introduced into the silicon device layer. In the silicon device layer 620 adjacent the region 624 is an $n^{++}$ doped region 625. In some embodiments, the p+ doping is of the order of 1E15 to 1E17 per cubic centimeter. In some embodiments, both p++ and n++ doping are greater 1E18 per cubic centimeter. In other embodiments, the device of the invention can be fabricated on a substrate, such as a semiconductor wafer, or a substrate made from other materials that are not semiconductors, such as quartz, aluminum oxide, sapphire, and the like.

The germanium body 606 is deposited adjacent the silicon device layer 620, for example by epitaxy after all of the doped regions in the silicon device layer 620 are completed. In some embodiments, the region 621 is in electrical contact with the germanium body 606. In some embodiments, the region 622 is in contact electrical with the germanium body 606. In some embodiments, the region 623 is in electrical contact with the germanium body 606. In other embodiments, the germanium body 606 is not in mechanical contact with either or both of regions 621 and 623. The discussion of how the germanium body 606 may be fabricated is described in further detail in co-pending U.S. patent application Ser. No. 14/644,122.

As used herein, the term "a modest doping level" is intended to denote a level of doping that is present in the silicon device layer 620 before any additional doping is deliberately added during processing. In some embodiments, the regions having a modest doping level may in fact have additional doping added simply as an artifact of the doping of nearby, or adjacent, regions. This additional doping may come about by inaccuracies in locating a dopant deposition or implantation or by diffusion of dopant during an annealing, activation or heat treatment step in the course of ordinary semiconductor processing. In some embodiments, a region having a modest doping level can have doping that is lower than either the $p^{++}$ doped region 621 or the $p^+$ doped region 623. In some embodiments, the p-type dopant is boron (B). In some embodiments, the n-type dopants are one or more of phosphorus (P), arsenic (As) and antimony (Sb). In other embodiments, the n++, p+ or p++ regions can be counter-doped such that an n-type dopant is used in a majority p-type region or a p-type dopant is used in a majority n-type region.

An oxide layer 608 is provided that covers the silicon device layer 620 and the germanium body 606. There are no metal contacts made to the germanium body 606. The electrical contacts to the germanium body 606 are made by way of the $p^{++}$ doped region 621 on one side and by way of the $p^+$ doped region 623, the region 624 and the $n^{++}$ doped region 625 on the other side. A voltage is applied to the device such that the electrons that are generated in the Ge body are allowed to move into the region 622, and then to the avalanche region 624, while the holes that are generated in the Ge body are allowed to move to the p++ region 621. Aluminum conductors 610 and 612 are provided to connect the $p^{++}$ doped region 621 with a p terminal 611 and the $n^{++}$ doped region 625 with an n terminal 613, respectively, so that the electrical signal generated in the APD can be observed or used. In some embodiments, the conductors 610 and 612 can be fabricated using metals other than aluminum, for example, Cu, W or other common conductor metals.

The device shown in FIG. 6 keeps separate the absorption region (in the germanium) and the multiplication region (in the silicon device layer) for low noise APD behavior. Moreover, the germanium crystal quality is preserved as produced by epitaxy, free from degradation which would be caused by ion implantation or metal contacting.

The steps used to fabricate the device are to first produce all of the regions 621, 622, 623, 624 and 625 in the silicon device layer, and then provide the oxide layer 608. The Ge body 606 can be deposited in an aperture produced in the oxide layer 608. One or more layers can be deposited over the Ge body to provide mechanical protection and/or optical coatings, such as anti-reflection coatings. The metallization can then be applied.

In one embodiment, the Ge body has one or more metal contacts that may conduct current. In another embodiment, the Ge body is doped. In another embodiment, the silicon device layer is partially etched in selected regions. In one embodiment, the Ge body contains, at least partially, a compound containing at least two of silicon, germanium, carbon and tin. In another embodiment, the Ge body is grown using liquid phase epitaxy. In another embodiment, the doping regions are rounded to avoid sharp corners. In another embodiment, the Ge body is rounded to avoid sharp corners. In a further embodiment, the Ge body is grown on partially etched silicon. In a further embodiment, light is incident on the detector from multiple sides. In various embodiments, the germanium is grown using any convenient chemical vapor deposition technique, including, by way of example, ultra high vacuum CVD (UHV-CVD), metallo-organic CVD (MOCVD), plasma enhanced CVD (PEVCD), atmospheric pressure CVD (APCVD), low pressure CVD (LPCVD), rapid thermal; CVD (RTCVD) and reduced pressure CVD (RPCVD). In some embodiments, the silicon substrate is doped prior to device fabrication. In various embodiments, the doped regions comprise multiple implants and/or diffusions. In some embodiments, the doped regions vary in doping intensity, for example, being linearly doped. In some embodiments, the doping concentration varies as a function of depth in the silicon. In some embodiments, the dopants are counter-doped using an alternative species. In some embodiments, the Ge body is single crystal or polycrystalline. In some embodiments, the Ge body has a buffer layer (e.g. SiGe, amorphous Ge, SiN) between the silicon device layer and the main Ge body.

Device Operation

In some embodiments, the device will be operated by sending an optical signal to the device's input port. A bias voltage will then be applied across the electrical ports. A larger voltage will result in a larger responsivity and a higher gain. However, a large enough bias voltage will cause avalanche breakdown in which the avalanche process is in a critical regime during which the current is very high and the bandwidth and noise performance are degraded. Electrical controls can be used to operate the avalanche detector at a voltage chosen to maximize performance. The chosen regime may also be a function of the optical input power. Lower input power generally requires a higher gain. The current that flows out of the terminals is then detected.

The device may also be operated in "Geiger mode", in which the voltage is intentionally increased to be in the breakdown regime. In this mode of operation, a single photon will trigger a self-sustaining current that must then be quenched by some type of circuitry to reset the detector. This mode is efficient at detecting single photons.

The avalanche mechanism is sensitive to temperature. Thus a thermal control may be used with the detector. In some embodiments, the substrate on which the detector sits may be placed onto a thermo-electric cooler. In some embodiments, a heater may be integrated into the detector structure for maximally efficient thermal control. Some embodiments may utilize a heater or a thermoelectric cooler in order to adjust the bandgap energy of the photodetector absorption region. Some embodiments may utilize this heater or thermoelectric cooler in order to control the absorption of the photodetector as a function of input wavelength. Some embodiments may utilize this heater or thermoelectric cooler in order to stabilize the gain or breakdown voltage of the photodetector. Some embodiments may include both a cooler and a heater, which may be operated alone or together, so as to control a range of operation of the device (e.g., the heater operates if the device temperature falls below a lower threshold, and the cooler operates if the device temperature rises above an upper threshold, with the other of the heater or the cooler turned off when the temperature is above the lower threshold and below the upper threshold, respectively).

Figure 4:
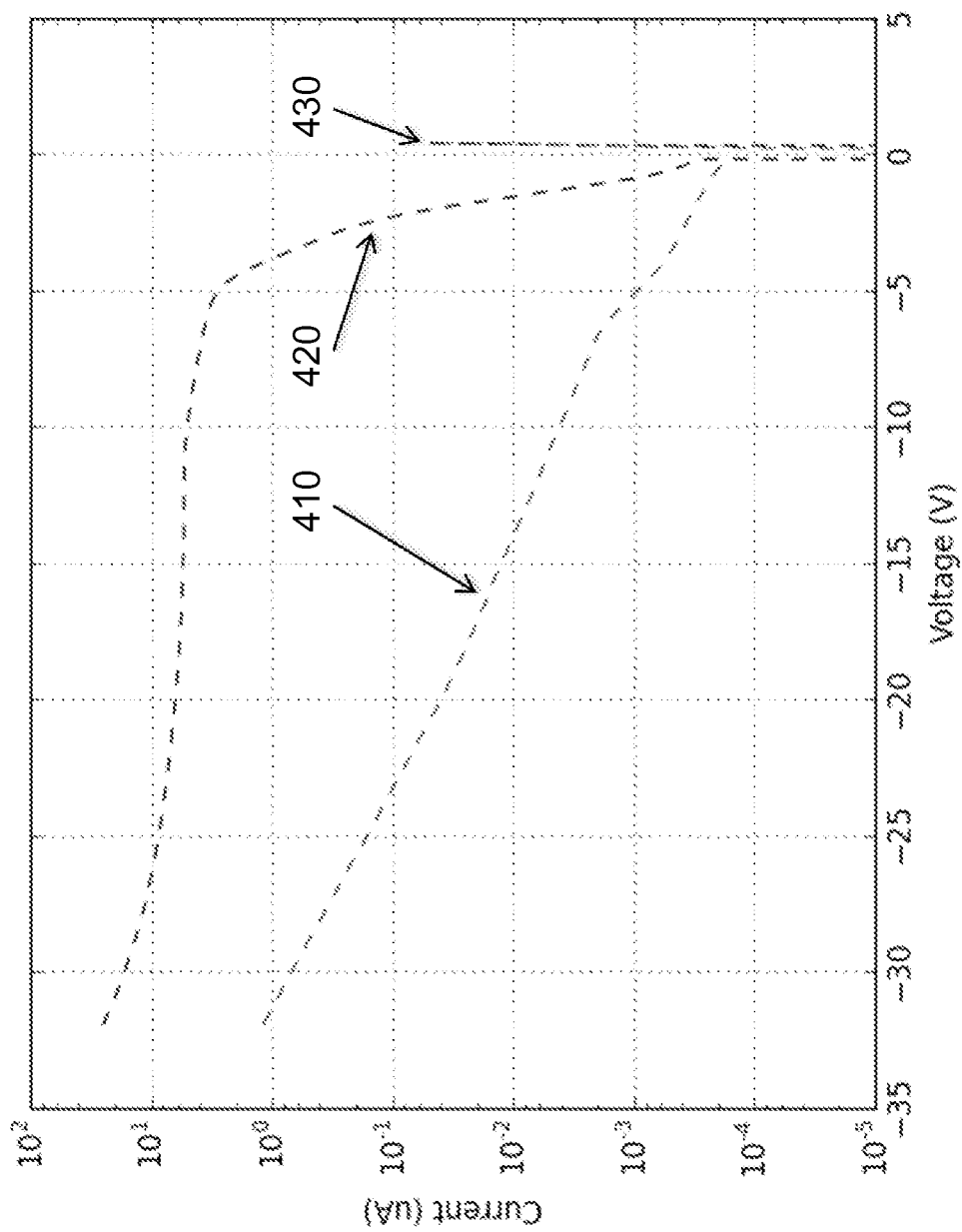
FIG. 4 is a graph of observed photocurrent current vs. voltage and dark current vs. voltage for a sample device constructed and operated according to principles of the invention.

FIG. 4 is a graph of observed photocurrent current vs. voltage and dark current vs. voltage for a sample device that was constructed and operated. In FIG. 4, the current vs. voltage curves 410, 420 and 430 are shown. As one can see, the device that produced the curve 420 clearly generated photocurrent in the avalanche photodiode's reverse bias regime. Avalanche gain is apparent in curve 420 near −30 V. The dark current vs. voltage curve 410 shows that this device has relatively low dark current relative to the photocurrent with less than 1 µA of dark current at −30 V.

Figure 5:
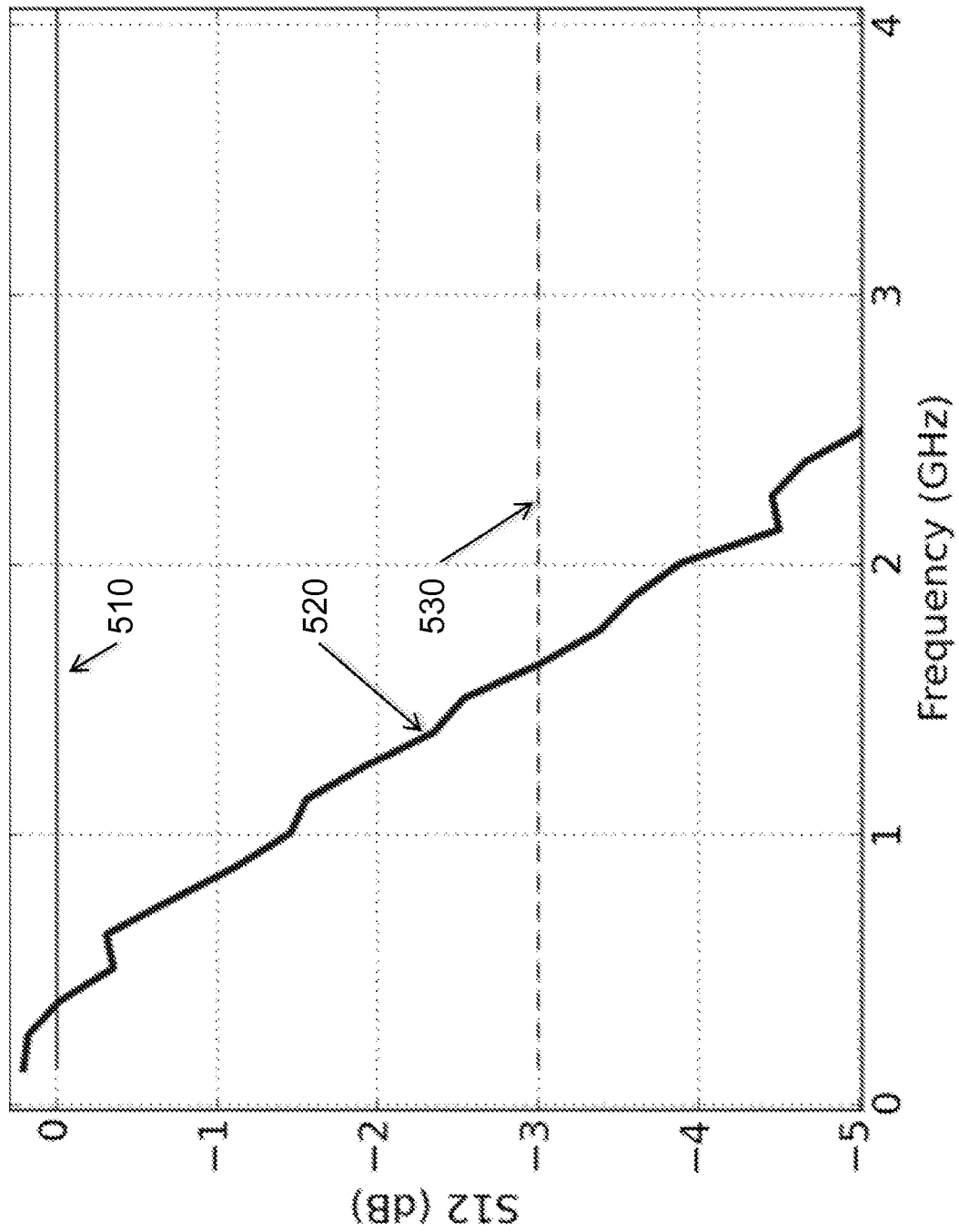
FIG. 5 is a graph of observed $S_{12}$ parameter vs. frequency for a device constructed and operated according to principles of the invention.

FIG. 5 is a graph of an observed $S_{12}$ parameter vs. frequency for a device constructed and operated according to principles of the invention. The $S_{12}$ is a measure of the electro-optic frequency response of the photodetector. In FIG. 5, the horizontal line 510 indicates normalized response power I, and the horizontal line 530 indicates a response power that would be reduced from I by −3 dB. The observed curve 520 shows that the −3 dB frequency is greater than one GHz (e.g., in the vicinity of 1.6 GHz for the specific device that was measured).

Design and Fabrication

Methods of designing and fabricating devices having elements similar to those described herein are described in one or more of U.S. Pat. Nos. 7,200,308, 7,339,724, 7,424, 192, 7,480,434, 7,643,714, 7,760,970, 7,894,696, 8,031,985, 8,067,724, 8,098,965, 8,203,115, 8,237,102, 8,258,476, 8,270,778, 8,280,211, 8,311,374, 8,340,486, 8,380,016, 8,390,922, 8,798,406, and 8,818,141, each of which documents is hereby incorporated by reference herein in its entirety.

See also the description given in U.S. patent application Ser. No. 14/644,122, filed Mar. 10, 2015, the disclosure of which is hereby incorporated by reference herein in its entirety.

Definitions

As used herein, the term "optical communication channel" is intended to denote a single optical channel, such as light that can carry information using a specific carrier wavelength in a wavelength division multiplexed (WDM) system.

As used herein, the term "optical carrier" is intended to denote a medium or a structure through which any number of optical signals including WDM signals can propagate, which by way of example can include gases such as air, a void such as a vacuum or extraterrestrial space, and structures such as optical fibers and optical waveguides.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, patent application publication, journal article, book, published paper, or other publicly available material identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. An avalanche photodetector, comprising:
   a substrate;
   a device layer including a plurality of regions on the substrate, comprising:
      a first contact region including a first level of p or n doping,
      a modest doping region,
      a charge region including a same kind of doping as the first contact region, but at a second level of doping, less than said first level of doping,
      an avalanche region, and
      a second contact region including a third level of doping, opposite in kind to the first and charge regions;
   a light-absorbing body adjacent to the device layer;
   a first electrical terminal in electrical communication with the first contact region; and
   a second electrical terminal in electrical communication with the second contact region.

2. The avalanche photodetector according to claim 1, wherein the modest doping region includes a doping level that is lower than either the first contact region or the charge region.

3. The avalanche photodetector according to claim 2, wherein the modest doping region includes a doping level that is lower than either the first contact region or the charge region by approximately an order of magnitude.

4. The avalanche photodetector according to claim 1, wherein the avalanche region includes a doping level that is lower than either the first contact region or the charge region.

5. The avalanche photodetector according to claim 4, wherein the avalanche region includes a doping level that is lower than either the first contact region or the charge region by approximately an order of magnitude.

6. The avalanche photodetector according to claim 1, wherein the light-absorbing body is in electrical contact with at least one of the charge region, the modest doping region, and the first contact region, wherein there are no metal contacts with the light-absorbing body.

7. The avalanche photodetector according to claim 6, further comprising an oxide layer covering the light-absorbing body preventing metal contact with the light-absorbing body.

8. The avalanche photodetector according to claim 1, wherein the light-absorbing body is in electrical contact with the charge region.

9. The avalanche photodetector according to claim 1, wherein the light-absorbing body is in electrical contact with the modest doping region, and not in mechanical contact with the first contact region or the charge region.

10. The avalanche photodetector according to claim 1, wherein the light-absorbing body comprises a material with a ionization rate of approximately 1.

11. The avalanche photodetector according to claim 1, wherein the light-absorbing body comprises germanium.

12. The avalanche photodetector according to claim 11, wherein the light-absorbing body includes doping.

13. The avalanche photodetector according to claim 1, wherein the light-absorbing body consists of an intrinsic germanium body.

14. The avalanche photodetector according to claim 1, wherein the device layer comprises a material with an ionization rate of less than 0.1.

15. The avalanche photodetector according to claim 1, wherein the device layer comprises silicon.

16. The avalanche photodetector according to claim 15, wherein the substrate comprises a semiconductor wafer.

17. The avalanche photodetector according to claim 16, wherein the semiconductor wafer comprises a silicon-on-insulator wafer including the silicon device layer.

18. The avalanche photodetector according to claim 1, wherein the light-absorbing body comprises a triangular shape.

19. The avalanche photodetector according to claim 1, further comprising a buffer layer between the light-absorbing body and the device layer comprising at least one of SiGe, amorphous Ge, and SiN.

* * * * *